United States Patent [19]

Lucek et al.

[11] Patent Number: 5,796,765
[45] Date of Patent: Aug. 18, 1998

[54] OPTICAL PULSE SEQEUNCE GENERATOR

[75] Inventors: Julian Kazimirez Lucek; Kevin Smith, both of Suffolk, United Kingdom

[73] Assignee: British Telecommunication public limited company, London, England

[21] Appl. No.: 617,868
[22] PCT Filed: Jun. 24, 1996
[86] PCT No.: PCT/GB94/02239
§ 371 Date: Mar. 25, 1996
§ 102(e) Date: Mar. 25, 1996
[87] PCT Pub. No.: WO95/10870
PCT Pub. Date: Apr. 20, 1995

[30] Foreign Application Priority Data

Oct. 11, 1993 [EP] European Pat. Off. ............ 93308067
Apr. 7, 1994 [GB] United Kingdom ............... 9406882
May 3, 1994 [EP] European Pat. Off. ............ 94303193

[51] Int. Cl.$^6$ .................................................. H01S 3/10
[52] U.S. Cl. .................................. 372/25; 372/6; 372/18; 372/26
[58] Field of Search .................. 372/6, 25, 18, 372/26

[56] References Cited

U.S. PATENT DOCUMENTS

| | | | |
|---|---|---|---|
| 5,477,555 | 12/1995 | Debeau et al. | 372/6 |
| 5,497,386 | 3/1996 | Fontana | 372/6 |
| 5,513,194 | 4/1996 | Tamura et al. | 372/6 |
| 5,577,057 | 11/1996 | Frisken | 372/6 |
| 5,623,362 | 4/1997 | Nitsuda et al. | 372/6 |

*Primary Examiner*—Leon Scott, Jr.
*Attorney, Agent, or Firm*—Nixon & Vanderhye, P.C.

[57] ABSTRACT

An optical pulse sequence is generated by applying a repetitive optical signal to an optical modulator connected in the laser cavity of a mode-locked laser. The pulse sequence in the laser cavity is then output. The repeat period of the repetitive optical signal is set to be equal to, or an integer multiple of, the cavity round-trip time. The laser is thereby driven to output pulses in bit positions corresponding to the non-zero pulses of the input repetitive optical signal. In one example, the output pulse sequence is used to control an optical switch to provide an OTDM programmable multiplexer using optical signals.

20 Claims, 10 Drawing Sheets

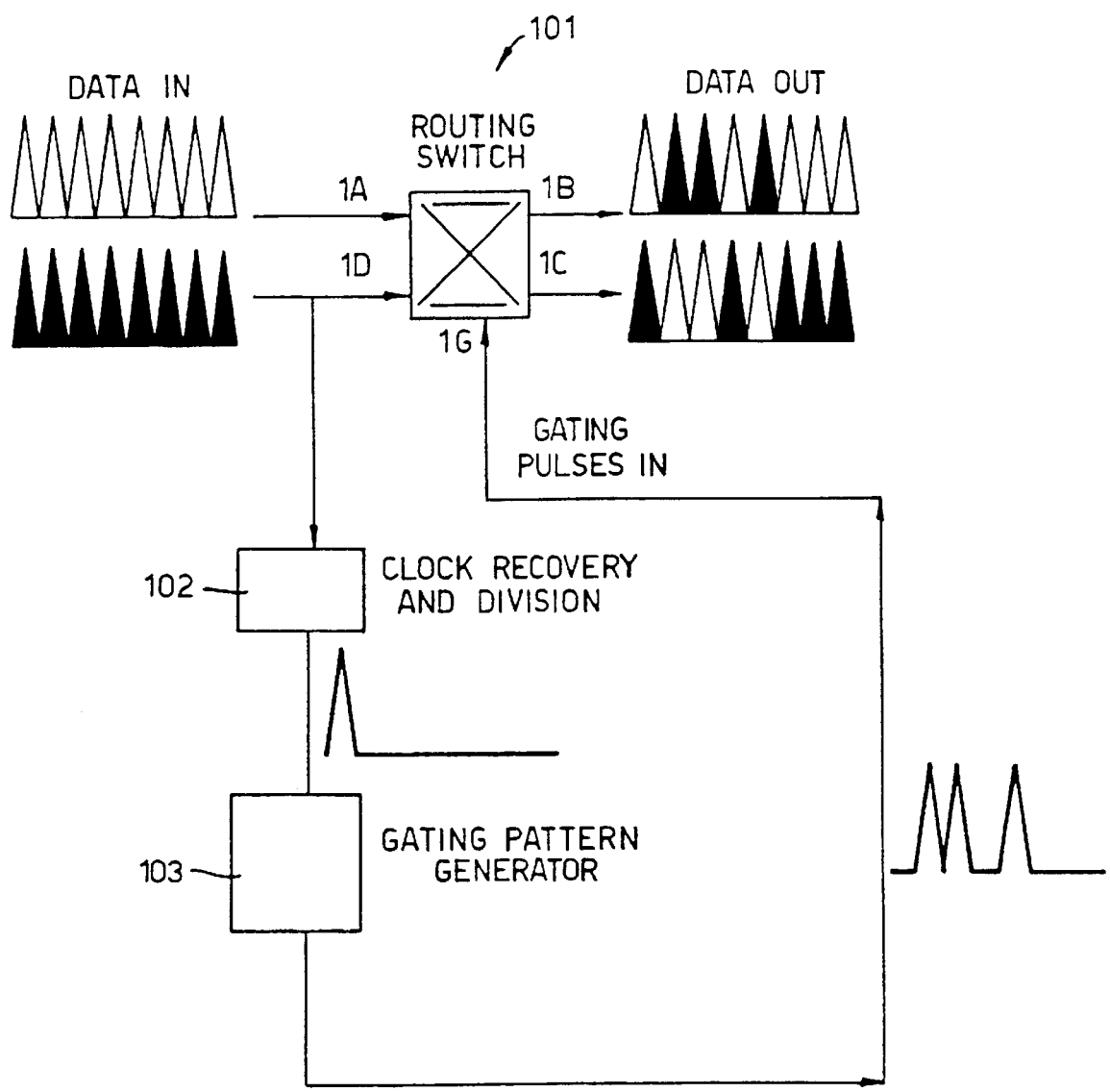

A1 A2 A3 A4 A5 A6    A → ... → E  A1 A2 B3 D4 B5 C6
B1 B2 B3 B4 B5 B6    B → ... → F  D1 D2 C3 B4 C5 A6
C1 C2 C3 C4 C5 C6    C → ... → G  B1 C2 A3 C4 D5 B6
D1 D2 D3 D4 D5 D6    D → ... → H  C1 B2 D3 A4 A5 D6
OTDM
PIPES IN

PATTERN GENERATORS

CLOCK
RECOVERY/DIVISION

OPTICAL PULSE SEQEUNCE GENERATOR

BACKGROUND TO THE INVENTION

The present invention relates to a method and apparatus for generating a desired optical pulse sequence in response to an input optical signal. The invention also encompasses an all-optical switch based on such pulse generation techniques. The present applicants, earlier International application PCT/GB93/00863 filed 26th Apr. 10 1993, and the paper by K. Smith and J. K. Lucek, Electronic Letters,28, 1814 (1992) disclose a system in which a pulse sequence input to a modulator in the cavity of a mode-locked laser results in the laser outputting a clock signal corresponding to the timing waveform of the input data, i.e. having an output pulse corresponding to each bit position of the input pulse sequence, irrespective of whether there is a one or a zero (a pulse or a null) in a given bit position.

This clock may be used in producing a regenerated signal but this requires a further stage in which the recovered clock is modulated by the original signal.

SUMMARY OF THE INVENTION

According to a first aspect of the present invention, there is provided a method of generating an optical pulse sequence comprising applying a repetitive optical signal to an optical modulator connected in the laser cavity of a mode-locked laser, and outputting a pulse sequence from the laser cavity, characterized in that the repeat period of the repetitive optical signal is equal to, or an integer multiple of, the cavity round-trip time, the laser thereby being driven to output pulses in bit positions corresponding to the non-zero pulses of the input repetitive optical signal.

The first aspect of the present invention provides an all-optical method for generating a desired pulse sequence. The output pulse sequence is found to have superior pulse characteristics with reduced noise and timing jitter, and so is suitable to be used as a regenerated signal to replace the input signal. As further described below, the output pulse sequence may also be used, for example, in the operation of an all-optical demultiplexer, or in other signal processing or switching devices.

The present inventors have found that if a repetitive signal, such as a repeated multi-bit word, or a sequence of OTDM frames all having zeros in certain predetermined bit positions, is used as the input data stream for a modulator in a laser cavity, and if the repetition period is matched to the round trip time of the cavity, or a multiple thereof, then instead of outputting a clock signal, the laser replicates the input pulse sequence. That is, the output from the laser, although as before being locked to the timing of the input pulse sequence, now has zeros where there are zeros in the input pulse pattern, or, in the case of an OTDM frame, zeros in those bit positions corresponding to those channels in the programming data stream which are set OFF.

Preferably the laser is arranged to continue to output the pulse sequence after the input pulse sequence has been removed or modified.

The method of this aspect of the invention may be used to provide an optical memory which maintains the pulse sequence at its output even after the original generating sequence has been removed. To this end, the cavity may include a pulse shaping element so that it functions as a hybrid active/passive mode-locked device. Then, after initial active mode-locking in response to the input pulse stream, the laser remains passively mode-locked to sustain the output pulse sequence. Appropriate pulse shaping devices are discussed in the above-cited paper and International application. Alternatively, the laser may be actively mode-locked by an additional modulator driven by an appropriate clocking signal.

According to a second aspect of the present invention, there is provided a method of controlling an optical switch, characterized by a applying a repetitive optical signal to a modulator connected in the cavity of a laser thereby mode-locking the laser, the repeat period of the repetitive optical signal being equal to or an integer multiple of the cavity round-trip time, outputting the pulse train generated in the cavity in response to the applied repetitive optical signal, and applying the pulse train or a signal derived therefrom to the control input of an optical switch arranged to route incoming data to different outputs depending on the state of the signal at the control input.

This aspect of the invention provides a method of programming an optical switch such as an OTDM (optical time division multiplexing) demultiplexer which can be implemented using solely optical programming signals thereby avoiding the limitations in switching or control speeds which arise where electronic programming is used. The repetitive optical signal may be a signal generated locally for the specific purpose of programming the demultiplexer, or may be the OTDM signal itself. In this case the programming can be controlled remotely by appropriate switching of the OTDM signals at the signal source or sources followed by transmission of the signals over a network to a switching node. When the programming signal is an OTDM signal, then it is the zeros in the bit positions corresponding to the non-selected channels which are repeated. The other bit positions carry data pulses and so may vary from repetition to repetition, provided that on average the value of each of these bit positions is non-zero.

Preferably signals from one of the different outputs of the optical switch are applied to the modulator in the optical cavity to provide the said repetitive optical signal. Preferably the method includes setting the optical switch to a state in at least part of each input pulse is output at the said one output, irrespective of the state of the control input, and in which the data stream at the input is non-zero only in those bit positions corresponding to the OTDM channels which are to be selected by the demultiplexer.

In the preferred implementation of this aspect of the invention, the output of the optical switch, comprising signals in those bit-positions selected in response to the control signal at the control input of the switch, is applied to the modulator in the cavity of the mode-locked laser. This then drives the mode-locked laser to output further control pulses in those selected bit-positions which are in turn applied to the control input of the switch, and so on. The whole system then operates in a self-sustaining loop.

Before the self-sustaining steady-state condition described above is set-up, the system is initialized by a start-up procedure. In this procedure, initially only the channels to be selected are turned on in the data stream supplied to the data input of the switch. But since there is not yet an appropriate control sequence at the input to the switch, the switch is, for the duration of this phase, set in a state such that all the input data is transmitted to the output connected to the mode-locked laser. For example, in the preferred implementation using a loop mirror, this is done by biasing the loop to be partially in reflecting mode and partially in transmitting mode in the linear regime. The data transmitted through the switch then drives the modulator in the laser to produce the required control pattern at its output. Once that control output is set-up the switch can be returned to its normal operating condition in which data is only switched to the output connected to the laser when there is a coincident control pulse at the control input. The method may include inputting a first OTDM data stream and one or more additional data channels to the switch and substituting the additional data channel or channels in the data stream output from the switch.

The switch may be used to carry out more complex functions than simply dropping channels from an OTDM data stream. In particular it can be used to add in channels from a second source. This function can be extended to provide full cross-switching of two or more input OTDM data streams. In the case of a switch formed as a NOLM, this may be done using circulators at the input and output of the loop. Appropriate switching structures are described in further detail below.

According to a third aspect of the present invention, there is provided an optical switching system comprising an optical switch having at least one signal input and a plurality of signal outputs and a control input, and an optical pulse sequence generator comprising a mode-locked laser having a modulator connected in the laser cavity and including an input for a repetitive optical signal which in use is applied to the modulator, the cavity having a round-trip time such that the repeat period of the repetitive optical signal is equal to or an integer multiple of the said round-trip time, the output of the optical pulse sequence generator being connected directly or indirectly to the control input of the optical switch and the switch thereby routing incoming data to different outputs depending on the state of the signal at the control input.

BRIEF DESCRIPTION OF THE DRAWINGS

Embodiments of the different aspects of the present invention will now be described, by way of example only, with reference to the accompanying drawings in which:

FIG. 7 is a diagram showing a modified non-linear loop mirror for use in the circuit of FIG. 4a;

FIG. 10 is a schematic of a switch

DESCRIPTION OF EXAMPLES

Figure 1:
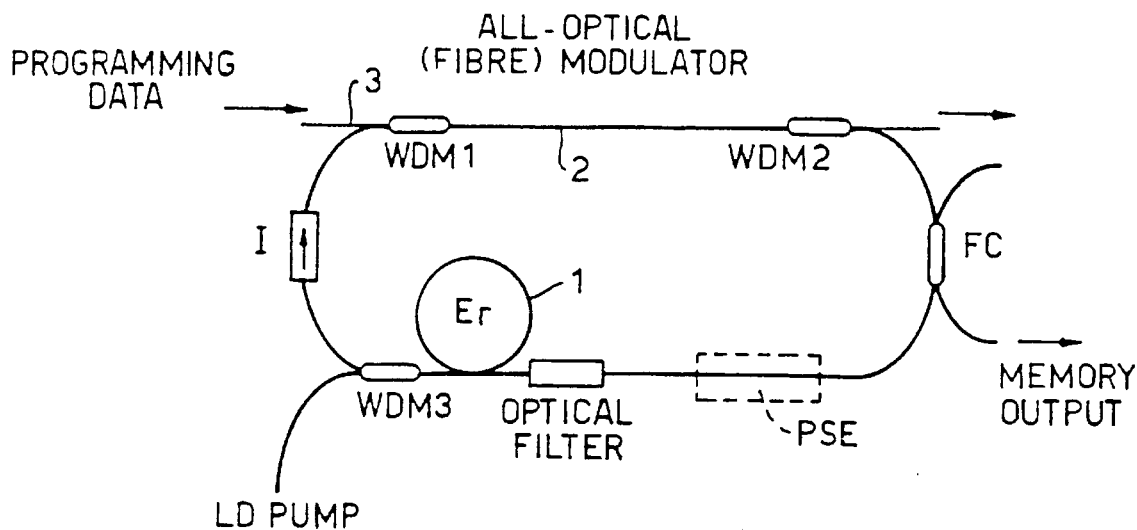
FIG. 1 is a diagram illustrating a first example of pulse generator circuit.

FIG. 1 shows a first example of a circuit implementing the present invention. A fibre laser 1 is configured in a loop and incorporates a fibre modulator 2 in the optical cavity. A transmission fibre 3 is also connected in common with the fibre modulator.

In this example, the fibre laser is based on an erbium-doped fibre (operating range 1.52–1.66 nm) pumped by a high power laser diode LD which may be a GRINSCH InGaAsP device.

The modulator comprises a single-mode optical fibre which, in the present example, has a length of 8.8 km. A suitable fibre is available commercially under the trade name SMF/DS CPC3 from Corning Inc., a US corporation of Corning, New York 14831. This is a dispersion-shifted fibre designed to operate in the 1550 nm region. It has a mode field diameter of 8.1 microns, a cladding diameter of 125 microns and a coating outside diameter of 250 microns. The effective group index of refraction is 1.476 at 1550 nm.

In the circuit of FIG. 1, each of the couplers WDM1, WDM2 is a bi-directional device incorporating an interference filter formed as an evaporation-deposited stacked dielectric. One wavelength passes straight through the filter while another wavelength is reflected. An appropriate device having these properties is available commercially from the company JDS FITEL as WDM coupler model no.WD1515Y-A1. A similarly constructed wavelength-selective coupler WDM3 is used to couple a laser diode pump to the fibre laser.

The circuit further comprises an optical filter F which may be an interference filter, used to control the frequency and width of the pulse in the laser cavity. An intra-cavity fibre isolator I ensures that the cavity function unidirectionally. A suitable isolator is model no. OIC-1100-1550 from BT & D Technologies. The output from the cavity is coupled by a fused fibre coupler, such as model no. SMC0202-155-OC from BT & D.

Figure 2A:
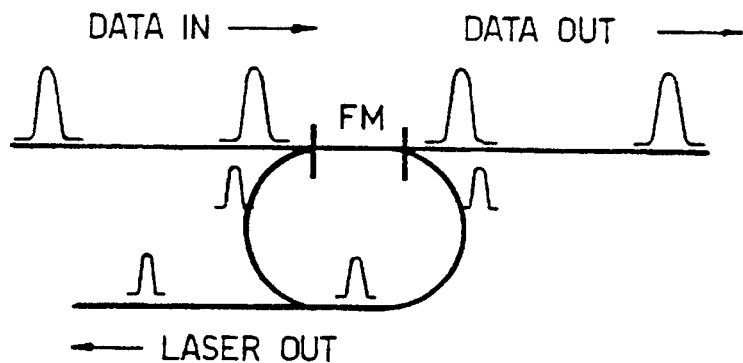
FIGS. 2a and 2b are schematics illustrating the operation of the circuit of FIG. 1.

In use, a pulse sequence carried on the transmission fibre is input to the fibre modulator where it cross-phase modulates light propagating in the laser cavity, thereby mode-locking the laser. In systems embodying the present invention, mode-locking is carried out using one of the higher harmonics of the cavity, rather than the fundamental mode. The laser cavity therefore contains a number of independent pulse trains. In the example shown schematically in FIGS. 2a and 2b, three data bits arrive at the modulator for every round-trip of the laser and each one of the three bits drives one of the three laser pulses in the ring.

Figure 2B:
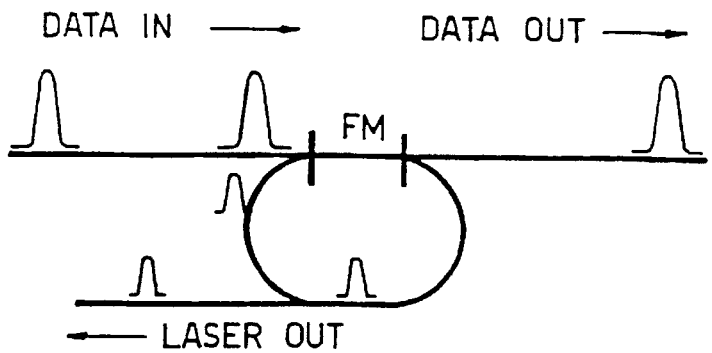

In the present examples, a repeated synchronized word is supplied to the modulator on the transmission fibre (FIG. 2b). The arrangement is as in FIG. 2a, the only difference being that now the laser is presented with a repetitive three bit sequence ("110" in this example) Each bit in the three bit sequence modulates a particular pulse in the ring laser. If the data bit is a "1" then a laser pulse is generated. If the data bit is a "0" then the laser is not modulated and no laser pulse arises in that time-slot. The output of the laser is therefore modulated with the same data sequence as the input data stream. In general, a laser driven at the mth harmonic of the mode-spacing can be mode-locked to a word that is m bits long, or to a word that is an integer divisor of m is bits long.

In the example of FIG. 1, the erbium fibre ring laser is mode-locked at around 1.007 GHz by a stream of −20 ps pulses drived from a gain-switched DFB laser. The continuous stream applied to the fibre. modulator on the transmission fibre was encoded using a LiNbO₃ amplitude modulator and a data generator. Since L, the characteristic length of the cavity. is approximately equal to 9 km, giving c/nL of 23 kHz, the driving frequency corresponds approximately to the 44000th harmonic of the mode-spacing, i.e. n~44000 so that there are 44000 pulses in the ring cavity at any one time. For the first example shown in FIG. 3a, the driving data stream is set to a repetitive eight bit sequence "11010010". The repetition rate is tuned to a mode of the ring cavity in order to force laser mode-locking. By stepping the frequency up or down in c/nL increments or decrements a pulse can be added or subtracted from the ring cavity. At a particular ring mode corresponding to 8n pulses in the cavity, where n is an integer, the laser generates at its output the same "11010010" repetitive sequence. As described previously, the laser output is in the form of a low jitter stream of near transform-limited pulses with a duration of around 10 ps.

FIG. 3c shows the output of the laser when the data repetition rate is stepped one mode-spacing up or down such that there are 8n+1 or 8n-1 laser pulses respectively in the ring cavity. This means that after each round-trip a laser pulse has slipped one bit with respect to the eight bit word in the driving data stream. Therefore, after eight round-trips, each laser pulse has been modulated by all the bits in the word. In this case, the resulting laser output consists of a continuous stream of 1's. This mode of operation is then essentially equivalent to that described in our above cited international application. If alternatively the slip is set so that each laser pulse does not see all of the modulating data bits, then the laser output takes the form of a word where some of the bits are either "1" or "0" depending on how many 1's that bit was modulated by on average, depending also on the exact laser parameters and the data word.

Figure 3:
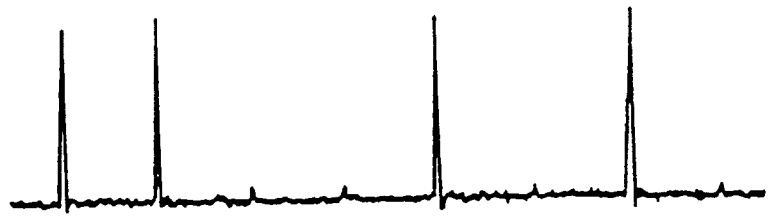
FIGS. 3a to 3f are intensity/time plots illustrating experimental data obtained using circuits embodying the present invention.
Figure 3:
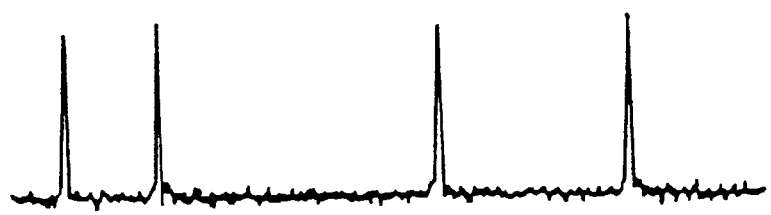
Figure 3:
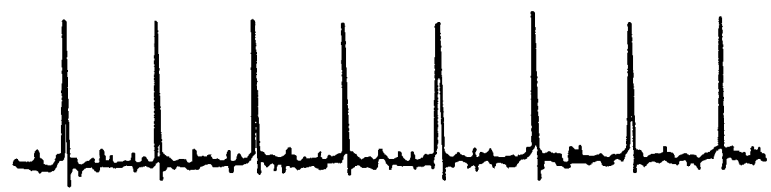
Figure 3:
Figure 3:
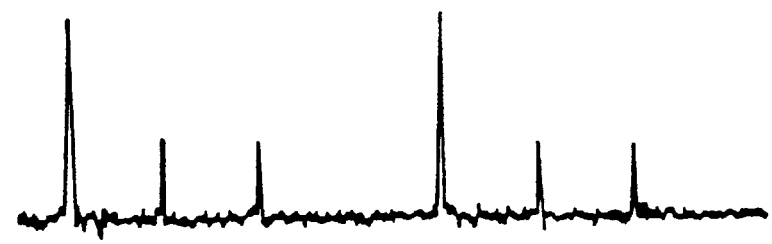
Figure 3:

The pulse generator may also be used to carry out logic operations on the driving word. FIGS. 3 (d) to 3 (f) show outputs obtained when the bit-rate is 8n+4 times the cavity frequency. Counting from left to right in the figures. the first and fifth bits see a . . . 111111. . . pattern of driving pulses; the second, third, sixth and seventh bits see a . . . 101010. . . pattern and the fourth and eighth bits see a . . . 000000. . . pattern. By altering the conditions within the laser cavity, we can alter the generated pattern. In (e) and to a-greater extent in (f) pulses that see a . . . 111111. . . pattern are favoured over those that see the a . . . 101010. . . pattern. Thus if we regard the driving word as a pair of four bit words, in (d) we see the result of an OR operation between corresponding bits in the two words and (f) we see the result of an AND operation.

The component indicated with dashed lines in FIG. 1 is an optical pulse shaping element which may optionally be included in the laser cavity. The inclusion of such an element changes the cavity from being entirely actively mode-locked to being partially or entirely passively mode-locked, that is a train of pulses once set up in the cavity becomes self-sustaining. The inclusion of such a pulse shaping element makes the circuit effective as an optical memory. That is, the programming data stream input to the modulator may be removed whilst still maintaining at the output of the laser cavity a pulse stream reproducing the pattern of the programming data. Such an optical memory has applications in a number of fields including optical processing or logic circuits.

The pulse shaping element may be provided by a further fibre modulator chosen to be soliton supporting at the optical powers at which the circuit operates, or alternatively, may be formed, for example from a non-linear semiconductor wave guide. In either case, the function of the element is to sharpen the pulses in the cavity, countering the tendency of the pulses to broaden in the absence of a modulating signal in the fibre modulator.

FIG. 4 shows a remotely optically programmable OTDM (optical time-division multiplexing) network node based on an optical sequence generator in accordance with the invention.

The steady-state operation of the device is as follows. The data enters a non-linear loop mirror (NOLM) at A. Control pulses from a pulse generating circuit PG as described above enter the loop through port E. If a control pulse is present at the loop mirror at the same time as a given data bit, then that bit is transmitted through the loop and emerges at B. Otherwise, that data bit is reflected and emerges at C. That is, the loop is in the reflecting mode in the linear regime. The control pulse pattern, e.g. 11001000, is repeatedly output from the pulse generator PG in response to the repeated driving signal and thus only bits in the first, second and fifth channels are ever transmitted through the loop. This demultiplexed data passes through the fibre laser and emerges at F. Delays within the circuit are controlled so that the control word output from the pulse generator PG is bit-synchronized with the input data at the loop mirror. Then the first bit of the control pattern is coincident with the first channel of the data stream and so on.

Prior to the steady-state condition described above being established, the node goes through a start-up procedure. Initially the loop mirror is biased to be partially in reflecting mode and partially in transmitting mode in the linear regime. This is done using a polarisation controller within the loop to alter the polarisation state of the light. Initially, only the channels to be demultiplexed are turned on at the input to the node. Each data pulse is partially transmitted through the loop. Thus the pattern generator receives, in the present example, a repeated dd00d000 pattern where d is a data pulse which may be 1 or 0, and over several repetitions has a non-zero time-average. A pattern of the form 11001000 is generated at the output of the pulse generator and is fed back to the control pulse input of the loop. The non-linear phase shift imparted by the control pulses on the data in the loop increases the proportion of each pulse transmitted through the loop. The loop bias is then changed so that it is completely in reflecting mode in the linear regime. The data pulses are still transmitted however as they are coincident with the control pulses, hence the pattern generator still continues to produce the 11001000 control pulse pattern. Now if the other channels are switched on then since the loop is in reflecting mode in the linear regime, and no control pulses are coincident with the data in these other channels, those channels are reflected from the loop. As shown schematically in FIG. 4c, a number of such programmable network nodes may be chained together. In use, the nodes can all be programmed remotely in a cascade: that is the first (upstream) node is programmed in the manner described above, and the channels not selected at that node are then used to program the next node downstream, and so-on.

As an alternative to changing the loop mirror from a partially transmitting state to a fully reflecting state after the completion of the start-up phase, the loop-mirror may be left permanently in a state in which it is, say, 1% transmitting in the linear regime. This means that a portion of each channel that is switched on after the start-up reaches the ring laser, however these channels do not create pulses within the laser because the power required to create pulses in the laser cavity is greater when pulses already exist than when there are no pulses in the cavity. The disadvantage of this arrangement is that the extinction ratio is compromised: the demultiplexed data streams contain a small amount of light in the empty channels.

Figure 5:
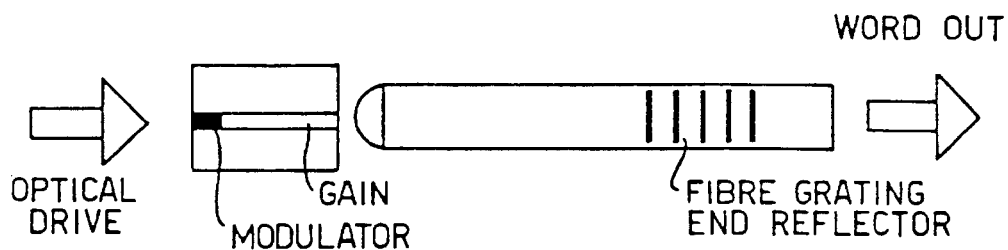
FIG. 5 is a diagram showing schematically an alternative embodiment of a pulse generator circuit.

Although the above examples are described using fibre technology, the present invention is by no means limited in this respect and other types of optical components and circuits may be used. For example, the embodiment of FIG. 5 shows a pattern generator based on a hybrid semiconductor/fibre circuit. The first element in the circuit is a semiconductor gain medium and a saturable absorber integrated with the gain medium and arranged to be pumped by the incoming repetitive optical signal. The output of the semiconductor is coupled to an external fibre cavity incorporating a fibre grating end reflector.

Figure 6:
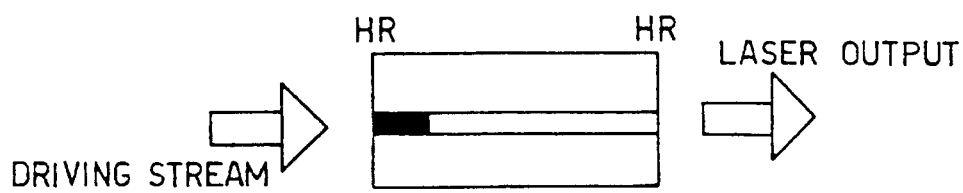
FIG. 6 is a diagram showing schematically a further alternative embodiment.

FIG. 6 shows a further alternative embodiment using purely semiconductor components. In this case, the laser cavity is defined between the end walls of the semiconductor component. Again the semiconductor incorporates a saturable absorber aligned with a gain medium in a channel formed in a semiconductor substrate. A Bragg filter may be incorporated in the structure to tune the device to a required wavelength.

Figure 4A:
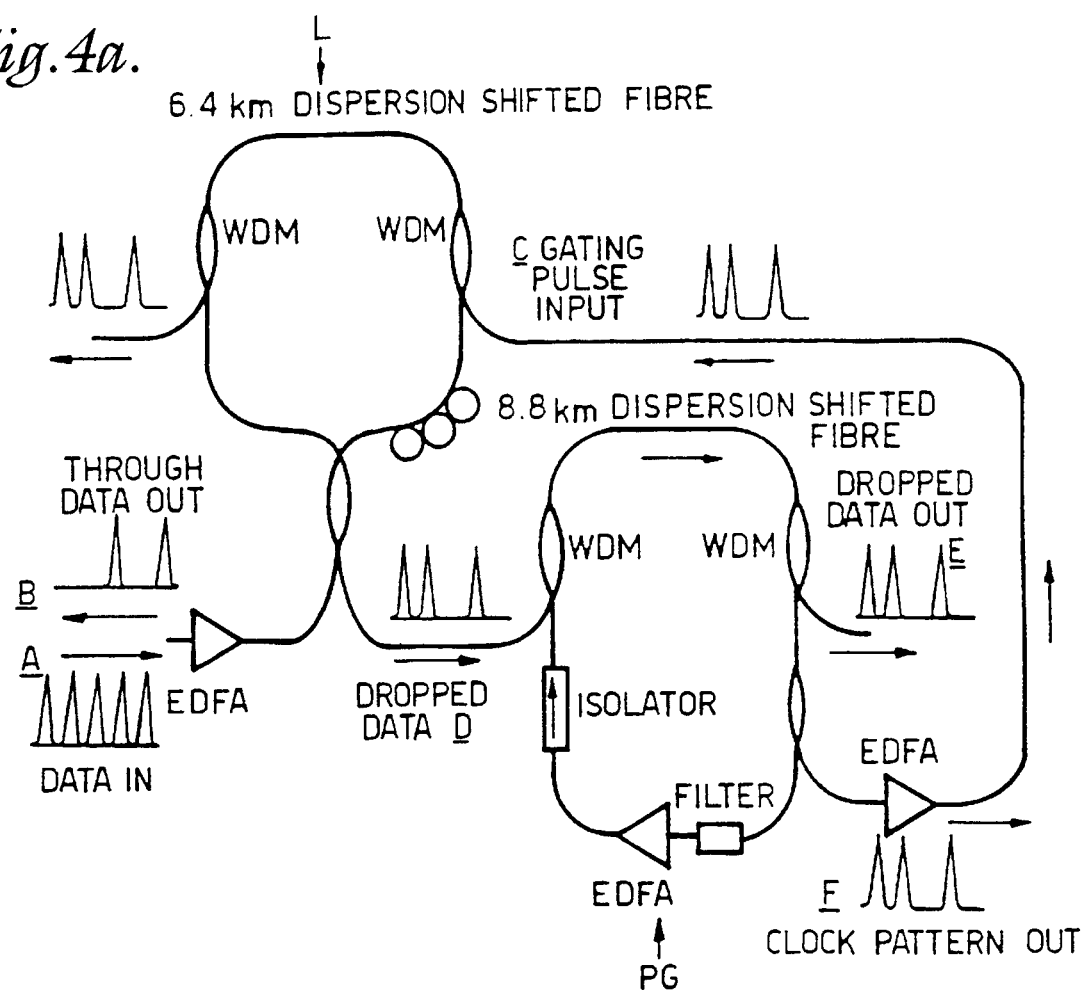
FIG. 4a is a circuit diagram showing a remotely programmable OTDM network node.
Figure 4B:
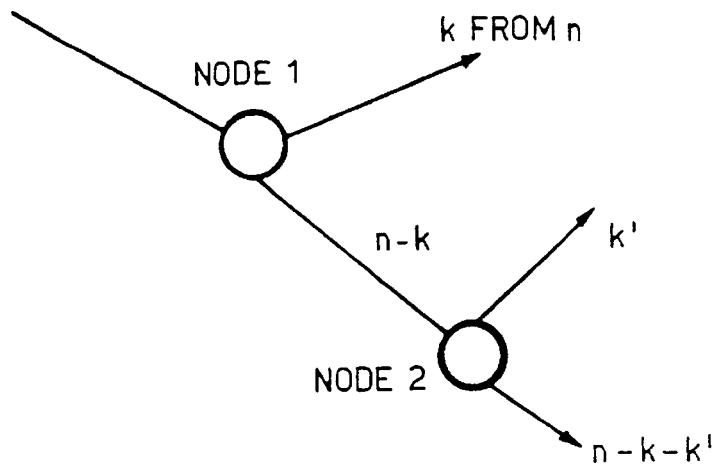
FIGS. 4b and 4c are schematics of a cascaded pair of nodes and a node respectively.
Figure 4C:
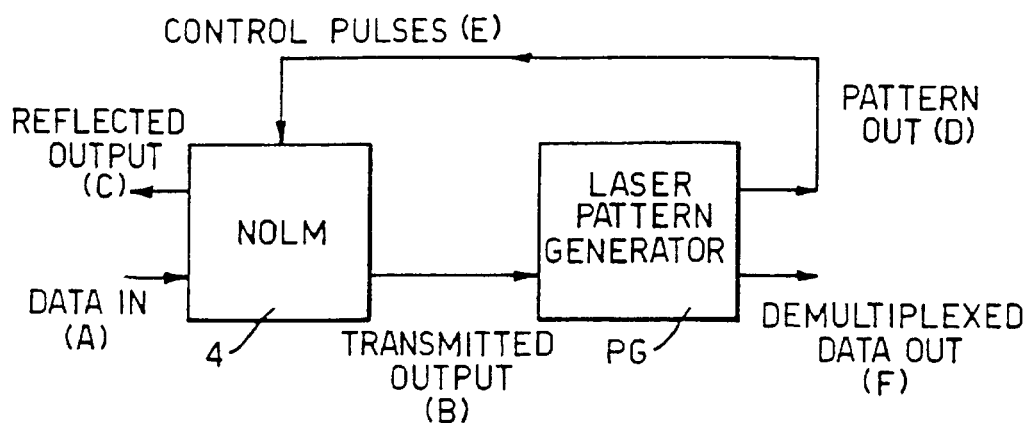
Figure 7:
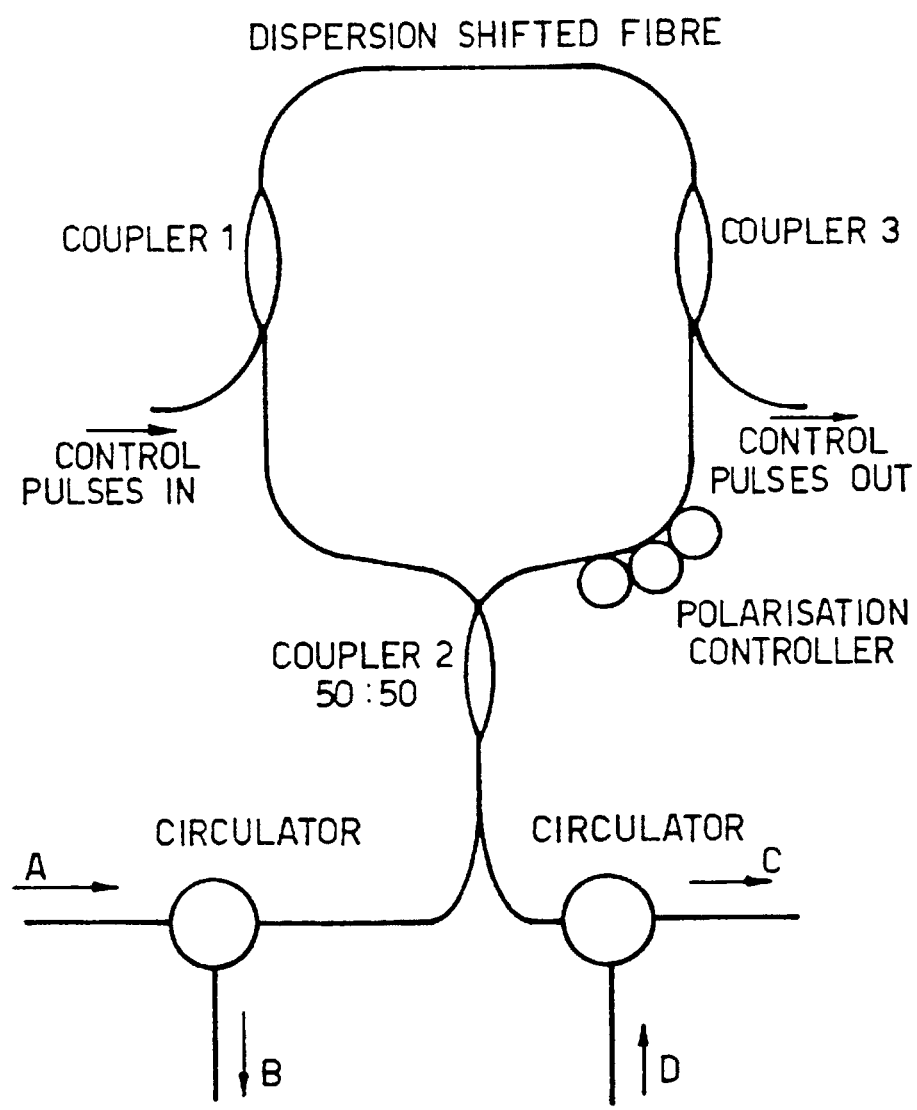

FIG. 7 shows a modified form of the loop mirror L for use in the circuit of FIG. 4a. In this modified loop, optical circulators C1, C2 are provided on the input and output branches of coupler 2. Appropriate circulators are manufactured by Optics for Research as model number OC-IR2-3 and available commercially in this country from Lambda Photometrics Limited of Harpenden, Hertfordshire. Such circulators in general use a crystal of the type known as a Faraday rotator. This has the property that the plane of polarisation of incident light is rotated in the same direction irrespective of the direction of travel through the crystal. The crystal is arranged with polarisers on its input and output such that the circulator functions as a three port device. Light entering the device at port 1 emerges from port 2, light entering at 2 emerges from 3, and light entering at port 3 emerges from 1.

Figure 8A:
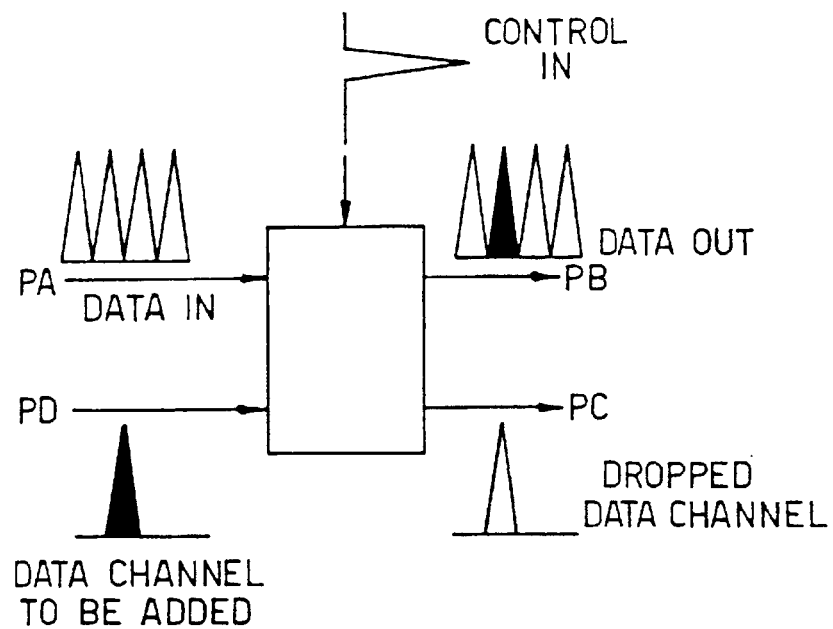
FIGS. 8a and 8b are diagrams illustrating the use of the loop mirror of FIG. 7.
Figure 8B:
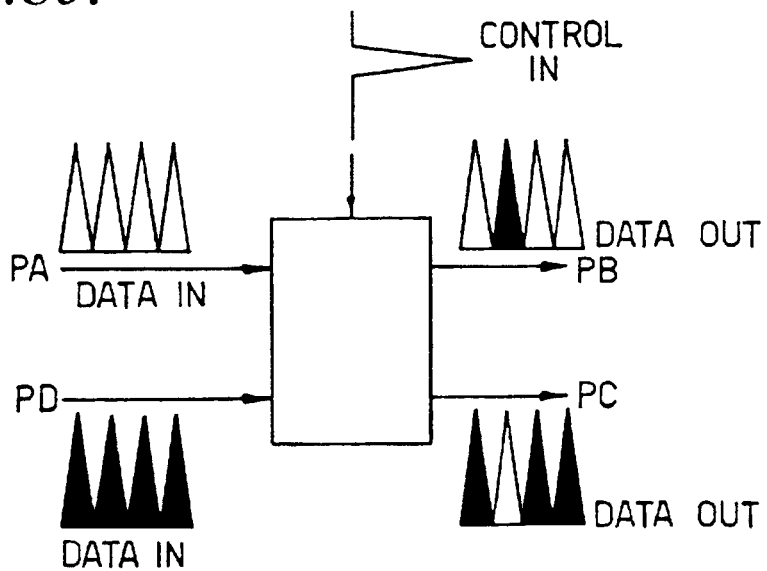

Using the circulators, it becomes possible to add channels at the node, as well as dropping channels. The optical control pulses applied to the loop determine the port from which a given data bit emerges. In the example shown schematically in FIG. 8a the loop is used to drop or demultiplex one channel from an OTDM pipe and add another channel in its place. The data stream to be added is introduced at port PD in such a way that the pulses within that channel arrive at the same time as pulses within the channel to be dropped. A data pulse at port PD will emerge from port PB and hence is merged with the non-dropped part of the OTDM data stream. Such a function has been carried out, for example, in a system in which a 10 Gbit/s channel was dropped from a 40 Gbit/s data stream and another channel added in its place. This function can be extended to a full cross-connect function (FIG. 8b), in which fully populated OTDM data streams arrive at both ports PA and PD. In this case, the presence of a control pulse results in the exchange of a bit between the two data streams. An array of such devices can be used in an OTDM node, allowing data channels from several incoming pipes to be switched onto outgoing pipes.

As an alternative to the use of a fibre modulator to provide the non-linearity for the loop, other devices may be used. For example, a semiconductor amplifier may be used as the non-linear material. Also, high numerical aperture (NA) optical fibres may be used.

The network of nodes described above with respect to FIG. 4b can be extended to include an ADD function as described above. Tributary data streams may be included in the added channels. The nodes are started-up in a sequence which proceeds from the first upstream node to the following downstream nodes.

Figure 9:
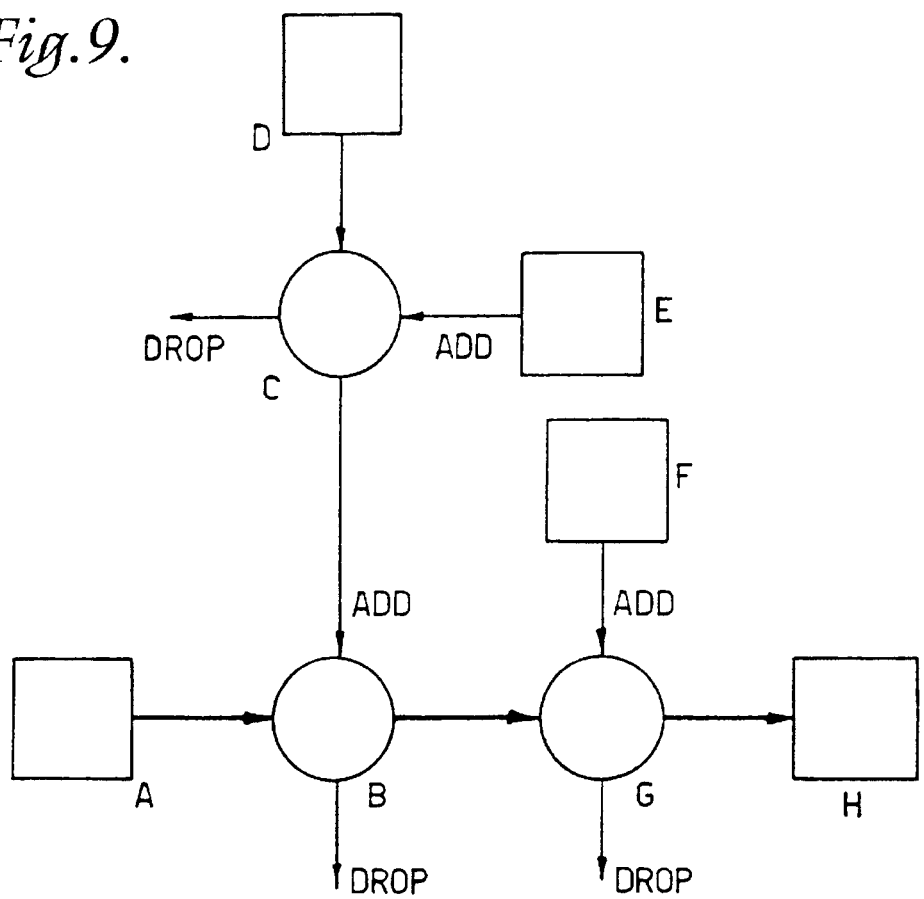
FIG. 9 is a schematic of an optical network having a bus topology.

FIG. 9 shows a network having a bus-type topology. In the Figure circles denote remotely programmable nodes as described above, and squares denote data sources or terminations. In the sequence described below, once a data channel has been switched on, it is left switched on. The appropriate start up sequence for such a bus network is then as follows:

switch on channels at D to be dropped at C, start up node C switch on channels at A to be dropped at B, start up node B switch on channels at A, D, E to be dropped at G, start up node G switch on channels to be sent from F and remaining channels at A, D and E—these all arrive at H.

FIG. 10 shows a further example of an OTDM switching node embodying the present invention. In this example the pattern generator is used in a clock recovery and division stage, and its output, rather than being applied directly to control the switch, is processed by a gating pattern generator.

The demultiplexer of this example comprises an optical routing switch 101, providing a cross-connection between two optical inputs 1A, 1D, and two optical outputs 1B, 1C. The switch has a further input 1G for gating pulses which determine the setting of the switch. In the absence of a pulse at the input 1G then an optical pulse input at 1A is fed straight-through to 1B. In the presence of a pulse at input 1G a pulse input at 1A, is cross-connected to output 1C.

The appropriate control sequence for the input G is generated by splitting one of the input optical data streams using, for example, a 50:50 fibre coupler. The signal is then applied to a clock recovery and division circuit 102 which generates a clock signal at, e.g., 1/n of the bit-rate of the n-channel OTDM frames. The resulting optical clock pulse train is passed through a gating pulse pattern generator 103 to provide the pulse sequence which is applied to the control input G.

The clock recovery division circuit in this example is provided by a fibre-loop mirror demultiplexer as described above with reference to FIG. 4a. This device is started up in the usual way with only one of the n channels being transmitted during the start-up sequence. As a result the output from the device is locked to the clock of the input data stream but has a repetition rate of 1/n of the original line rate.

Figure 11:
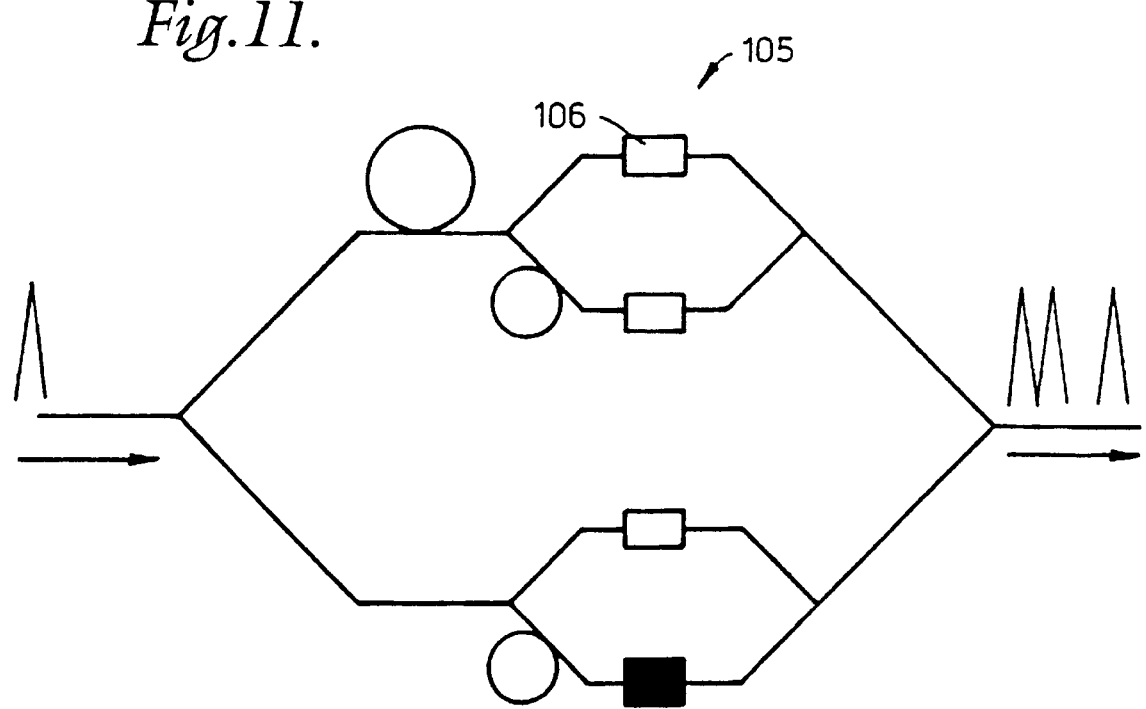
FIG. 11 is a word-forming network for use in the circuit of FIG. 10.

The gating pattern generator is shown in more detail in FIG. 11. It contains a splitter/delay line/combiner arrangement 105. The different paths provide different respective delays for the split input optical pulse. The delays are such that each input pulse results in n output pulses, the pulse spacing being equal to the OTDM bit spacing. Each arm of the network contains a shutter 106 that passes or blocks light. Thus the pattern of clock pulses required to gate the routing switch can be generated by controlling the status of each shutter. The shutters do not have to have an ultra-fast switching time so they can be electrically controlled and linked, for example, to a remote control centre responsible for configuring the network paths. A simple implementation of the device may use commercially available fibre couplers and solenoid-controlled moving-fibre switches. An appropriate switch is model no. SW11S manufactured by JDS Inc. of Canada and commercially available in the U.K. from AG Electro-optics of Tarporley, Cheshire. This switch functions by mechanically inserting an element into the path of an optical beam. Alternatively and preferably the gating network may be an integrated device using planar silica waveguide technology. The shutters in such an integrated network may be semiconductor laser amplifiers SLAs. The SLAs when turned ON can be used to provide gain, as well as carrying out the shutter function. Appropriate planar silica technology is disclosed in the paper by Cassidy et al. BT Technology Journal, Volume 11, Page 1377 (1993). As a further alternative, the optical pathways and splitters can be formed from passive semiconductor waveguides with active overlays to define SLAs to act as shutters.

Figure 12A:
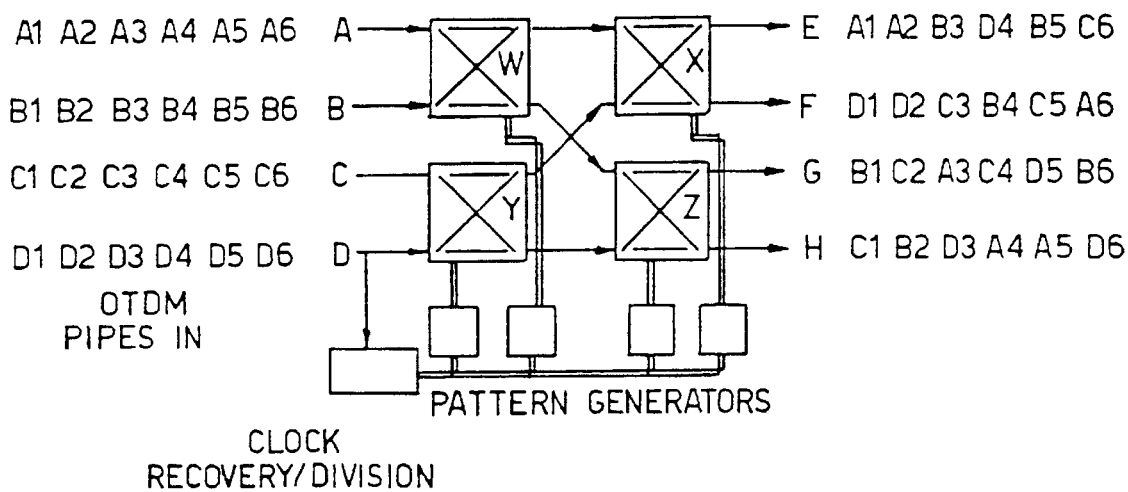
FIGS. 12a and 12b are schematics of alternative embodiments of a switch.
Figure 12B:
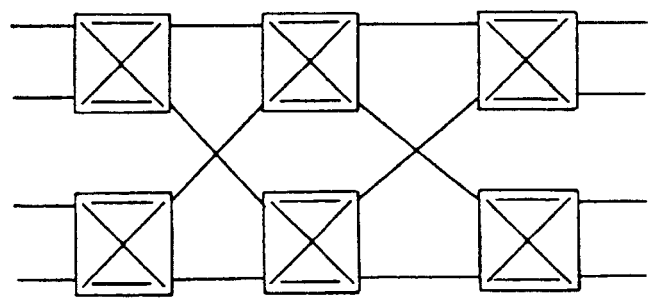

FIG. 12a shows an alternative embodiment in which instead of a single routing switch, a 2×2 array of cross-connect routing switches is used. This example allows four input OTDM pipes to be connected to four output pipes. The example shown is a blocking array. That is to say not all combinations of cross-connections are possible. For example, a channel from A cannot be routed to E at the same time that B is routed to F. A non-blocking array could be constructed although this would require additional cross-connect routing switches. For example, the corresponding non-blocking array shown in FIG. 12b, known as a Benes array, requires six cross-connect routing switches. In either case, only one shared clock recovery device is required. If each cross-connect switch is to have a gating pattern independent of the others, then one gating-pulse pattern-generator is required per switch. In the example shown in the Figure, there are four input pipes and four output pipes, each carrying six time-multiplexed channels. The diagram shows where each input channel ends up e.g. "A3" means channel 3 from pipe A. Each switch is driven by a repeated six-bit pattern of control pulses. In the example shown the control pulse patterns are:

w 001110
x 000101
y 110100
z 010110 where the first bit of each sequence coincides with the arrival of bits from channel 1 at the corresponding switch, and so on. The figure shows the state of the array when the channel 3s are being switched. It will be understood that it is not a true "snap-shot" at one instant of time, since in reality the control pulses at x and z for a given channel should arrive later than the control pulses at w and y for that channel to take account of the time for the data to propagate between switches. The data path-lengths between w and x, w and z, y and z, y and x must be equal.

Figure 13:
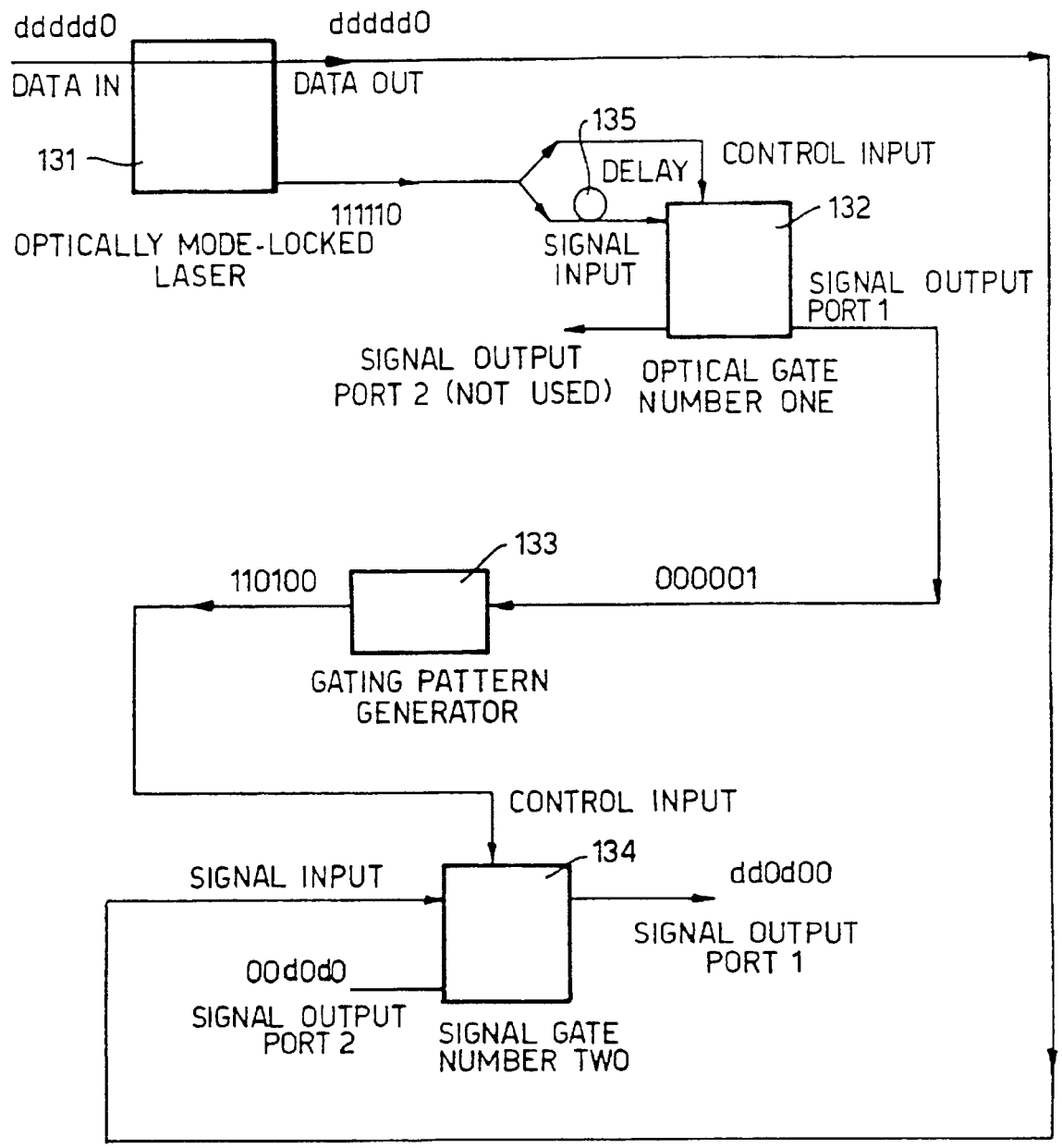
FIG. 13 is a further example of an OTDM switch.

FIG. 13 shows a further example of an OTDM switching node which, as in the example described immediately above, uses a gating pattern generator. In this example, the data being processed has in each frame a header bit which is always set to zero. Then when such frames are applied to a first optically mode-locked laser 131 as described above with reference to FIG. 1, the resulting pattern generated by the laser provides a frame synchronisation signal. The use of the present applicant's optical pattern generator to produce a frame synchronisation signal in this manner is proposed in the paper by M. Obro, P. Thorsen and S. B. Andreasen published at PP 1243–1244 Electronics Letters 21st Jul. 1994, volume 30, number 15.

Having generated in this manner a frame synchronisation pattern of the form . . . 111110, the pattern is inverted. This is done by using the pattern to control a delayed version of itself input to a first optical gate 132 via a delay (e.g. a fibre loop of appropriate length) 135. The delay is set to be any integer number of bit periods such that the zeros within the pattern and the delayed version of the pattern are not aligned in time at the gate 132. Then a bit arriving at the signal input of the gate 132 is routed to output port 1 only from the one bit position in which there is a zero at the control input. For all other bit positions, where there is a 1 at the control input, the signal is output to port 2. The output from port 1 is then an inverted form of the frame synchronisation signal and this signal is fed to a gating pattern generator 133 which functions in the manner described with respect to the embodiment of FIG. 10. This results in an appropriate gating pattern which is applied to a second optical gate 134, again in the fashion described above.

The optical gates 132 and 134 may both be formed from is non-linear loop mirrors in which the two pulse trains involved are distinguished by having orthogonal polarisations. In the case of the gate 132, the two pulse streams involved are at the same wavelength, by contrast with the previous examples in which signals were distinguished by different wavelengths, and the different polarisation states are therefore needed to separate the different pulse streams.

In the example shown, in order to separate the first, second and fourth channels from the remaining channels, the pattern of gating pulses produced by the pattern generator 133 is 110100.

We claim:

1. A method of generating an optical pulse sequence comprising:

applying a repetitive optical signal to an optical modulator connected in the laser cavity of a mode-locked laser, and outputting a pulse sequence form the laser cavity, the repeat period of the repetitive optical signal being equal to, or an integer multiple of, the cavity round-trip time, the laser thereby being driven to output pulses in bit positions corresponding to the non-zero pulses of the input repetitive optical signal.

2. A method as in claim 1, in which the laser is arranged to continue to output the pulse sequence after the input repetitive optical signal has been removed or modified.

3. A method as in claim 2, including the step off;

passing pulses in the laser cavity through a pulse shaping element arranged to sharpen the pulses.

4. A method of controlling an optical switch comprising:

applying a repetitive optical signal to a modulator connected in the optical cavity of a laser, thereby mode-locking the laser, the repeat period of the repetitive optical signal being equal to, or an integer multiple of, the cavity round-trip time, outputting the pulse train generated in the cavity in response to the applied repetitive optical signal, and applying the pulse train or a signal derived therefrom to the control input of an optical switch arranged to route incoming data to different outputs depending on the state of the signal at the control input.

5. A method as in claim 4, in which signals from one of the outputs of the optical switch are applied to the modulator in the optical cavity to provide the said repetitive optical signal.

6. A method as in claim 5, further comprising:

setting the optical switch to a state in which at least part of each input pulse is output at the said one output, irrespective of the state of the control input, and setting the data stream at the input to be non-zero only in those bit positions corresponding to the OTDM channels which are to be selected by the demultiplexer.

7. A method as in claim 4, in which a first OTDM data stream and at least one additional data channel is input to the switch and each additional data channel is substituted in the data stream output from the switch.

8. A method as in claim 7, in which the input to the switch comprises at least two OTDM data streams and the switch cross-switches channels between the different data streams in response to the signal at its control input.

9. A method as in claim 4, in which the said optical switch outputs in response to the control signal at the control input a recovered clock signal at an integer divisor of the clock rate of the input data stream.

10. A method as in claim 9, further comprising:
applying the recovered clock signal to a gating pattern generator, and
applying the signal output by the gating pattern generator to the control input of a further optical switch,
the further optical switch switching the said data stream between a plurality of outputs in response to the gating signal at the control input.

11. A method as in claim 9, in which the repetitive optical signal comprises OTDM data frames, all the data frames having a header including a null in a predetermined bit position, the mode-locked laser thereby generating a frame synchronization signal.

12. A method as in claim 11, further comprising:
inverting the frame synchronization signal and applying the inverted signal to a gating pattern generator thereby producing the control signal for the optical switch.

13. An optical switching system comprising:
an optical switch having at least one signal input and a plurality of signal outputs and a control input, and
an optical pulse sequence generator comprising a mode-locked laser having a modulator connected in the laser cavity and including an input for a repetitive optical signal which in use is applied to the modulator, the cavity having a round-trip time such that the repeat period of the repetitive optical signal is equal to, or an integer multiple of, the said round-trip time, the output of the optical pulse sequence generator being connected directly or indirectly to the control input of the optical switch and the switch thereby routing incoming data to different outputs depending on the state of the signal at the control input.

14. A system as in claim 13, in which an output of the optical switch is connected to the input of the pulse sequence generator to provide the said repetitive optical signal.

15. A system as in claim 14, including:
means for setting the optical switch, during a start-up phase, in a partially transmitting state in which all incoming signals are at least partially transmitted to the said output connected to the pulse sequence generator, irrespective of the state of the control input.

16. A system as in claim 13, in which the switch includes,
a first input for an OTDM data stream, and
a second input for at least one additional OTDM channel and is arranged to substitute the at least one additional channel in the data stream output from the switch.

17. A system as in claim 16, in which the switch includes inputs for two OTDM data streams and is arranged to cross-switch channels between the two data streams in response to the signal at the control input.

18. A system as in claim 13, in which the switch is arranged, in response to the control signal from the pulse sequence generator, to output a recovered clock signal at an integer divisor of the clock rate of an input data stream, the system further comprising:
a gating pattern generator connected to the output of the optical switch and arranged to generate from the recovered clock signal control signal for a further optical switch arranged to receive the said data stream.

19. A system as in claim 18, in which the signal output from the pulse sequence generator is a frame synchronization signal produced in response to OTDM data frames all having nulls in a predetermined header bit position and in which the optical switch connected to the output of the pulse sequence generator is arranged to invert the frame synchronization signal.

20. A system as in claim 18, in which at least one of the optical switch and the further optical switch comprises a non-linear loop mirror.

* * * * *